(12) United States Patent
Chi et al.

(10) Patent No.: US 12,119,047 B2
(45) Date of Patent: Oct. 15, 2024

(54) READOUT CIRCUIT STRUCTURE

(71) Applicant: CHANGXIN MEMORY TECHNOLOGIES, INC., Hefei (CN)

(72) Inventors: Sungsoo Chi, Hefei (CN); Shuyan Jin, Hefei (CN); Fengqin Zhang, Hefei (CN)

(73) Assignee: CHANXIN MEMORY TECHNOLOGIES, INC., Hefei (CN)

( * ) Notice: Subject to any disclaimer, the term of this patent is extended or adjusted under 35 U.S.C. 154(b) by 194 days.

(21) Appl. No.: 17/847,825

(22) Filed: Jun. 23, 2022

(65) Prior Publication Data

US 2023/0005522 A1 Jan. 5, 2023

Related U.S. Application Data

(63) Continuation of application No. PCT/CN2022/088701, filed on Apr. 24, 2022.

(30) Foreign Application Priority Data

Jul. 2, 2021 (CN) .......................... 202110751254.7

(51) Int. Cl.
*G11C 7/02* (2006.01)
*G11C 11/4091* (2006.01)

(52) U.S. Cl.
CPC ................ *G11C 11/4091* (2013.01)

(58) Field of Classification Search
CPC .................................................. G11C 11/4091
USPC ........................................................ 365/207
See application file for complete search history.

(56) References Cited

U.S. PATENT DOCUMENTS

| | | | | |
|---|---|---|---|---|
| 5,590,080 A | * | 12/1996 | Hasagawa | ........... G11C 11/4091 365/207 |
| 2007/0109904 A1 | * | 5/2007 | Hong | ................... H10B 12/482 365/230.03 |
| 2011/0075499 A1 | | 3/2011 | Lee | |
| 2018/0182449 A1 | | 6/2018 | Kim et al. | |
| 2019/0147925 A1 | | 5/2019 | Choi et al. | |
| 2019/0180811 A1 | | 6/2019 | Kim et al. | |
| 2020/0118614 A1 | | 4/2020 | Kim et al. | |

(Continued)

FOREIGN PATENT DOCUMENTS

| CN | 111292783 A | 6/2020 |
|---|---|---|
| CN | 112712837 A | 4/2021 |
| CN | 112767975 A | 5/2021 |

*Primary Examiner* — Hoai V Ho
(74) *Attorney, Agent, or Firm* — Syncoda LLC; Feng Ma (57) ABSTRACT

A readout circuit structure is provided, which includes: a first sense amplification circuit and a second sense amplification circuit, disposed adjacent to each other along an extension direction of a bit line, here the first sense amplification circuit is coupled to one memory array in the adjacent memory arrays by a first bit line, and is coupled to the other memory array by a first complementary bit line, and the second sense amplification circuit is coupled to one memory array in the adjacent memory arrays by a second bit line, and is coupled to the other memory array by a second complementary bit line; a first equalization pipe, connected to the first bit line; a second equalization pipe, connected to the first complementary bit line; a third equalization pipe, connected to the second bit line; and a fourth equalization pipe, connected to the second complementary bit line.

15 Claims, 5 Drawing Sheets

(56) References Cited

U.S. PATENT DOCUMENTS

2020/0227111 A1  7/2020  Kim et al.
2020/0372948 A1  11/2020 Kim et al.
2021/0272618 A1  9/2021  Kim et al.

* cited by examiner

READOUT CIRCUIT STRUCTURE

CROSS-REFERENCE TO RELATED APPLICATION

This is a continuation application of International Patent Application No. PCT/CN2022/088701, filed on Apr. 24, 2022, which claims priority to Chinese patent application No. 202110751254.7, entitled "READOUT CIRCUIT STRUCTURE" and filed with the National Intellectual Property Administration, PRC on Jul. 2, 2021. The disclosures of International Patent Application No. PCT/CN2022/088701 and Chinese patent application No. 202110751254.7 are hereby incorporated by reference in their entireties.

BACKGROUND

The dynamic random access memory (DRAM) is a semiconductor storage device commonly used in a computer and includes many repeated memory cells. Each memory cell generally includes a capacitor and a transistor. A gate of the transistor is connected to a word line, a drain thereof is connected to a bit line, and a source thereof is connected to the capacitor. A voltage signal on the word line can control turning on or turning off of the transistor, and then data information stored in the capacitor is read through the bit line, or the data information is written into the capacitor through the bit line for storage.

DRAMs may include a double data rate (DDR) DRAM, a graphics double data rate (GDDR) DRAM, and a low power double data rate (LPDDR) DRAM. With an increasing number of fields to which DRAMs are applied, for example, more DRAMs are applied in the mobile field, users have higher requirements for power consumption indicators of the DRAMs.

However, the performance of current DRAMs still needs to be improved.

SUMMARY

The present disclosure relates to, but not limited to, a readout circuit structure. According to an embodiment of the present disclosure, there is provided a readout circuit structure, disposed in a gap between memory arrays. The readout circuit structure includes: a first sense amplification circuit and a second sense amplification circuit, disposed adjacent to each other along an extension direction of a bit line, and configured to sense a voltage of a memory cell and output a logic 1 or 0 corresponding to the voltage, here the first sense amplification circuit is coupled to one memory array in the adjacent memory arrays by using a first bit line, and is coupled to the other memory array in the adjacent memory arrays by using a first complementary bit line, and the second sense amplification circuit is coupled to one memory array in the adjacent memory arrays by using a second bit line, and is coupled to the other memory array in the adjacent memory arrays by using a second complementary bit line; a first equalization pipe, one of a source and a drain thereof being connected to the first bit line; a second equalization pipe, one of a source and a drain thereof being connected to the first complementary bit line, here the first equalization pipe is configured to precharge a voltage of the first bit line to a preset voltage according to an equalization signal, and the second equalization pipe is configured to precharge a voltage of the first complementary bit line to the preset voltage according to the equalization signal; a third equalization pipe, one of a source and a drain thereof being connected to the second bit line; and a fourth equalization pipe, one of a source and a drain thereof being connected to the second complementary bit line, here the third equalization pipe is configured to precharge a voltage of the second bit line to the preset voltage according to the equalization signal, the fourth equalization pipe is configured to precharge a voltage of the second complementary bit line to the preset voltage according to the equalization signal, and the first equalization pipe and the third equalization pipe are disposed on a side of the first sense amplification circuit away from the second sense amplification circuit, and the second equalization pipe and the fourth equalization pipe are disposed on a side of the second sense amplification circuit away from the first sense amplification circuit.

DETAILED DESCRIPTION

It can be known from the Background that the performance of DRAMs in the prior art still needs to be improved.

It is found that an existing sense amplifier with an offset compensation function includes a turning-on process of a switching transistor in a precharge process of a bit line and a complementary bit line, resulting in an insufficient high charging speed for the bit line and the complementary bit line. With further reduction of sizes of transistors, a saturation current of the switching transistor decreases, and this situation is more serious, which does not help improve the read-write performance of the memory.

To resolve the foregoing problem, embodiments of the present disclosure provide a readout circuit structure, disposed in a gap between memory arrays, the structure including: a first sense amplification circuit and a second sense amplification circuit, disposed adjacent to each other along an extension direction of a bit line, and configured to sense a voltage of a memory cell and output a logic 1 or 0 corresponding to the voltage, here the first sense amplification circuit is coupled to one memory array in the adjacent memory arrays by using a first bit line, and is coupled to the other memory array in the adjacent memory arrays by using a first complementary bit line, and the second sense amplification circuit is coupled to one memory array in the adjacent memory arrays by using a second bit line, and is coupled to the other memory array in the adjacent memory arrays by using a second complementary bit line; a first equalization pipe, one of a source and a drain thereof being connected to the first bit line; a second equalization pipe, one of a source and a drain thereof being connected to the first complementary bit line, here the first equalization pipe is configured to precharge a voltage of the first bit line to a preset voltage according to an equalization signal, and the second equalization pipe is configured to precharge a voltage of the first complementary bit line to the preset voltage according to the equalization signal; a third equalization pipe, one of a source and a drain thereof being connected to the second bit line; and a fourth equalization pipe, one of a source and a drain thereof being connected to the second complementary bit line, here the third equalization pipe is configured to precharge a voltage of the second bit line to the preset voltage according to the equalization signal, the fourth equalization pipe is configured to precharge a voltage of the second complementary bit line to the preset voltage according to the equalization signal, and the first equalization pipe and the third equalization pipe are disposed on a side of the first sense amplification circuit away from the second sense amplification circuit, and the second equalization pipe and the fourth equalization pipe are disposed on a side of the second sense amplification circuit away from the first sense amplification circuit.

To make the objectives, technical solutions, and advantages of the embodiments of the present disclosure clearer, the following describes the embodiments of the present disclosure in detail with reference to the accompanying drawings. However, a person of ordinary skill in the art can understand that, in the embodiments of the present disclosure, many technical details are provided for readers to better understand the present disclosure. However, even without these technical details and various changes and modifications based on the following embodiments, the technical solutions claimed in the present disclosure may still be realized. The division of the following embodiments is for convenience of description, and should not constitute any limitation to the specific implementations of the present disclosure, and the various embodiments may be combined with each other without contradiction.

Figure 1:
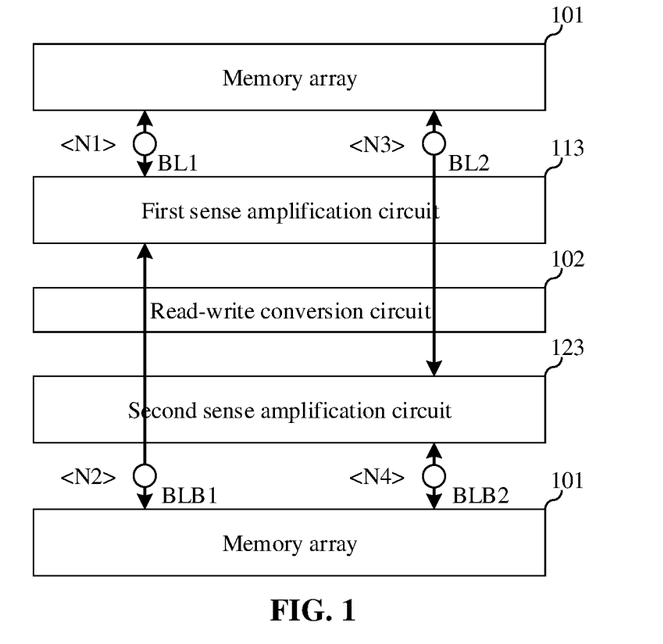
FIG. 1 is a schematic structural diagram of a readout circuit structure of 1×2 according to an embodiment of the present disclosure.
Figure 2:
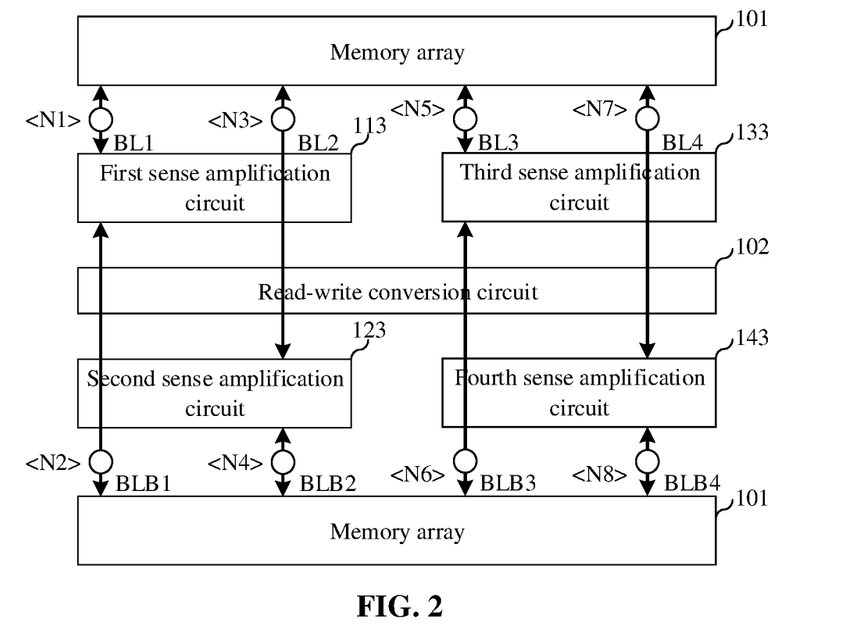
FIG. 2 is a schematic structural diagram of a readout circuit structure of 2×2 according to an embodiment of the present disclosure.
Figure 3:
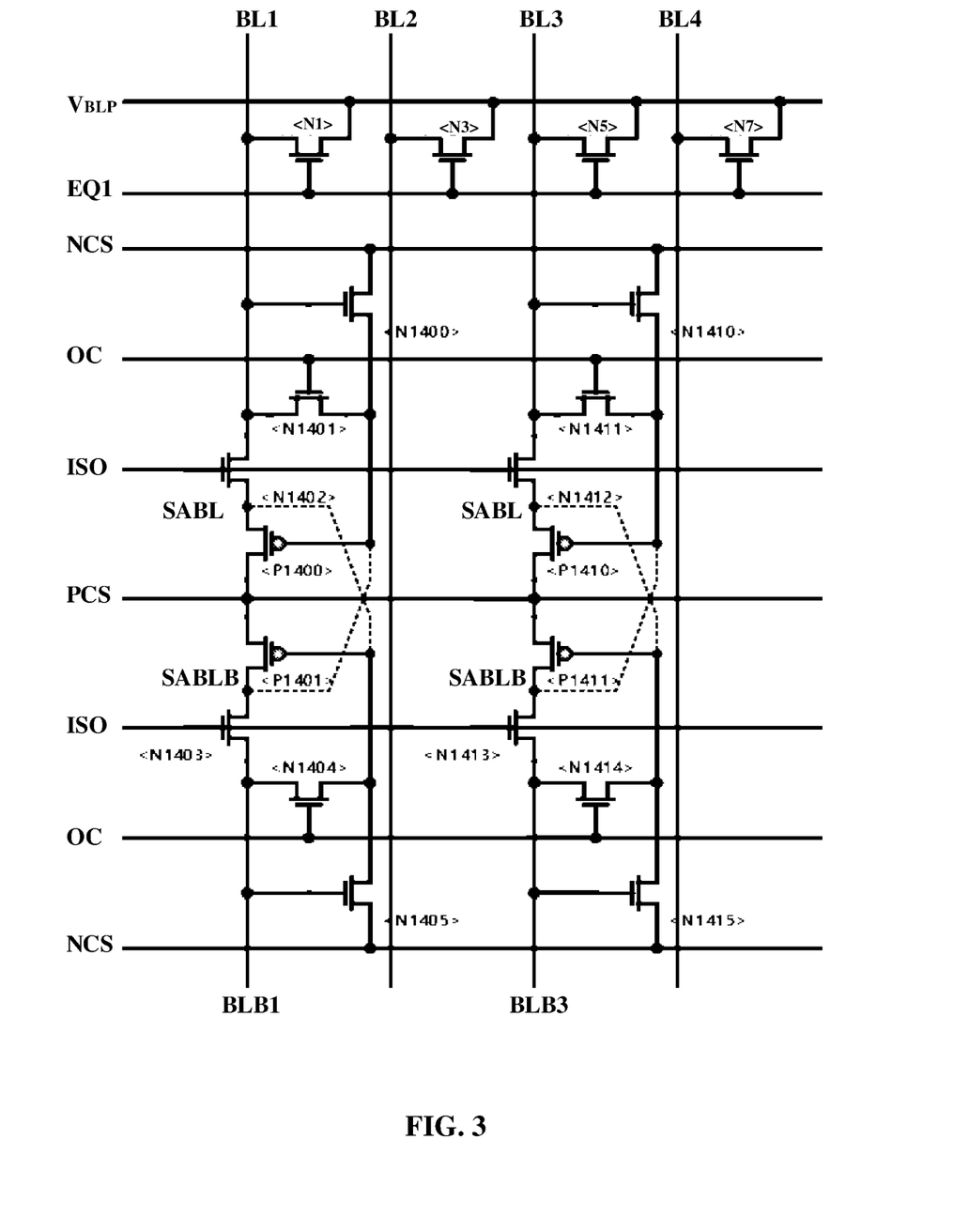
FIG. 3 is a schematic diagram of structures of a first sense amplification circuit and a third sense amplification circuit according to an embodiment of the present disclosure.
Figure 4:
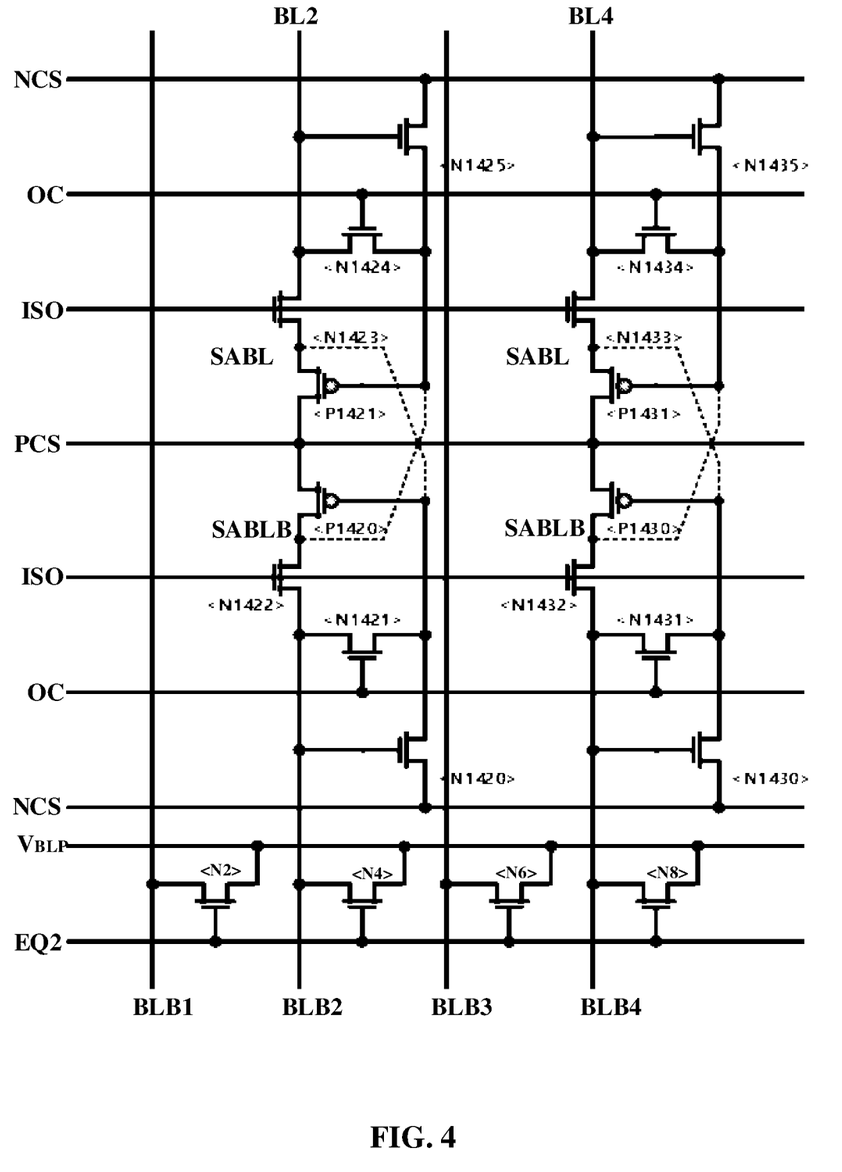
FIG. 4 is a schematic diagram of structures of a second sense amplification circuit and a fourth sense amplification circuit according to an embodiment of the present disclosure.
Figure 5:
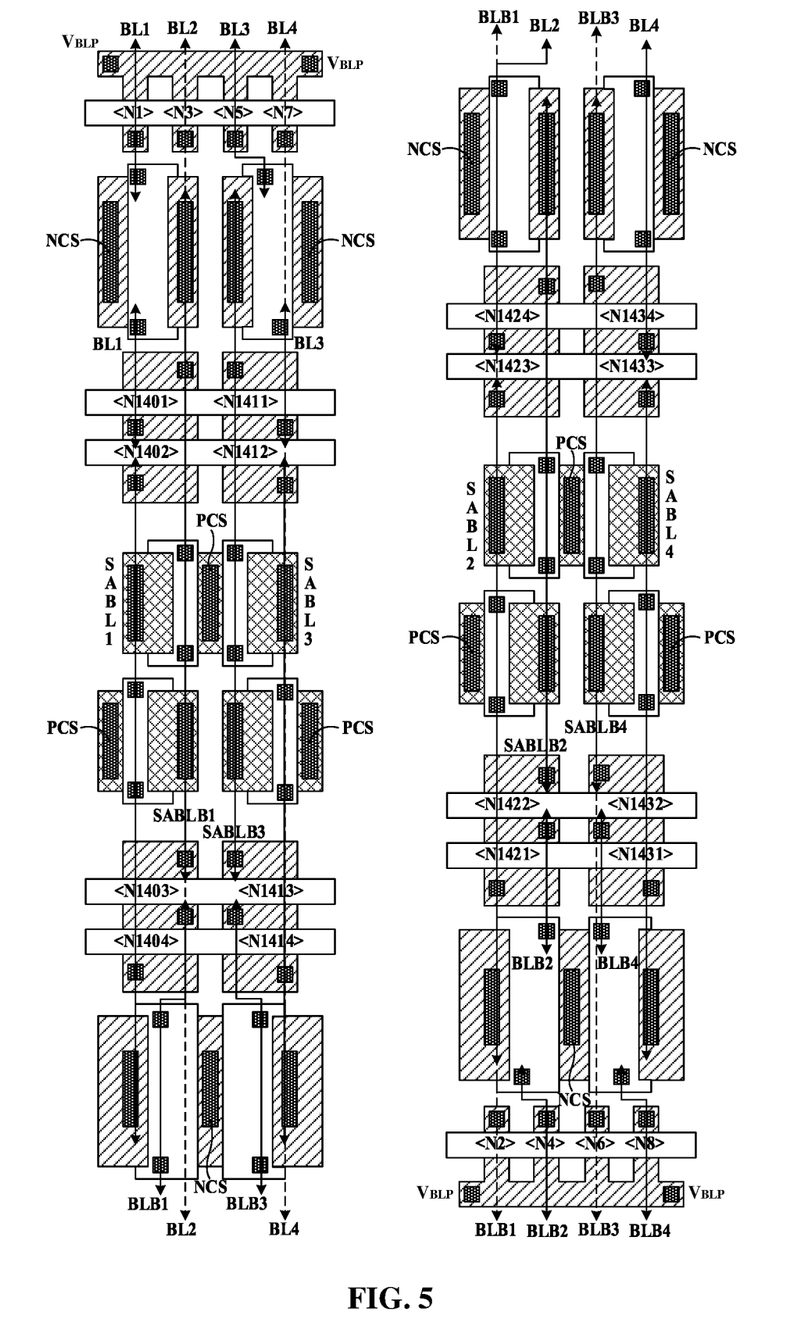
FIG. 5 is a layout of a first sense amplification circuit, a second sense amplification circuit, a third sense amplification circuit, and a fourth sense amplification circuit according to an embodiment of the present disclosure.

FIG. 1 is a schematic structural diagram of a readout circuit structure of 1×2 according to this embodiment; FIG. 2 is a schematic structural diagram of a readout circuit structure of 2×2 according to this embodiment; FIG. 3 is a schematic diagram of structures of a first sense amplification circuit and a third sense amplification circuit according to this embodiment; FIG. 4 is a schematic diagram of structures of a second sense amplification circuit and a fourth sense amplification circuit according to this embodiment; and FIG. 5 is a layout of a first sense amplification circuit, a second sense amplification circuit, a third sense amplification circuit, and a fourth sense amplification circuit according to this embodiment. The following further describes the readout circuit structure provided in this embodiment in detail with reference to the accompanying drawings:

Referring to FIG. 1, a readout circuit structure is disposed in a gap between memory arrays 101.

The memory array 101 has n rows and m columns of memory cells, and each memory cell is configured to store 1-bit data, that is, one memory array 101 can store (n×m)-bit data; and in a data readout process, a specific memory cell is gated, to read out data stored in the memory cell, or to write data into the memory cell.

The first sense amplification circuit 113 and a second sense amplification circuit 123 are disposed adjacent to each other along an extension direction of a bit line, and configured to sense a voltage of a memory cell and output a logic 1 or 0 corresponding to the voltage. The first sense amplification circuit 113 is coupled to one memory array 101 in the adjacent memory arrays 101 by using a first bit line BL1, and is coupled to the other memory array 101 in the adjacent memory arrays 101 by using a first complementary bit line BLB1. The second sense amplification circuit 123 is coupled to one memory array 101 in the adjacent memory arrays 101 by using a second bit line BL2, and is coupled to the other memory array 101 in the adjacent memory arrays 101 by using a second complementary bit line BLB2.

In this embodiment, to clearly distinguish the one memory array 101 from the other memory array 101, in the subsequent description, the memory array 101 to which the first sense amplification circuit 113 is connected by using the first bit line BL1 is referred to as a "first memory array"; and the memory array 101 to which the second sense amplification circuit 123 is connected by using the second complementary bit line BLB2 is referred to as a "second memory array".

In this embodiment, the readout circuit structure further includes: a read-write conversion circuit 102, configured to write external data into a memory cell of the memory array 101, or read out data in the memory cell.

In this embodiment, the read-write conversion circuit 102 is disposed between the first sense amplification circuit 113 and the second sense amplification circuit 123. In other embodiments, the read-write conversion circuit may alternatively be disposed between the first sense amplification circuit and the memory array or between the second sense amplification circuit and the memory array.

The readout circuit structure further includes: a first equalization pipe <N1>, one of a source and a drain thereof being connected to the first bit line BL1, here the first equalization pipe is configured to precharge a voltage of the first bit line BL1 to a preset voltage according to an equalization signal; a second equalization pipe <N2>, one of a source and a drain thereof being connected to the first complementary bit line BLB1, here the second equalization pipe is configured to precharge a voltage of the first complementary bit line BL1 to the preset voltage according to the equalization signal; a third equalization pipe <N3>, one of a source and a drain thereof being connected to the second bit line BL2, here the third equalization pipe is configured to precharge a voltage of the second bit line BL2 to the preset voltage according to the equalization signal; and a fourth equalization pipe <N4>, one of a source and a drain thereof being connected to the second complementary bit line BLB2, here the fourth equalization pipe configured to precharge a voltage of the second complementary bit line BLB2 to the preset voltage according to the equalization signal.

One terminal of the source and the drain of the first equalization pipe <N1> is directly connected to the first bit line BL1 to directly precharge the first bit line BL1, one terminal of the source and the drain of the second equalization pipe <N2> is directly connected to the first complementary bit line BLB1 to directly precharge the first complementary bit line BLB1, one terminal of the source and the drain of the third equalization pipe <N3> is directly connected to the second bit line BL2 to directly precharge the second bit line BL2, and one terminal of the source and the drain of the fourth equalization pipe <N4> is directly connected to the second complementary bit line BLB2 to directly precharge the second complementary bit line BLB2, that is, by directly connecting to the bit lines/complementary bit lines by using the equalization pipes, to directly charge the bit lines and the complementary bit lines, a case in which the bit lines and the complementary bit lines can only be precharged in a precharge process with turning on of a switching transistor is avoided, thereby speeding up charge of the bit lines and the complementary bit lines.

It should be noted that the "preset voltage" mentioned above is a voltage required for precharge in the precharge stage of the memory, and a specific voltage magnitude is set according to a precharge voltage required for the normal operation of the memory. The value of the "preset voltage" is not limited in this embodiment.

In addition, the first equalization pipe <N1> and the third equalization pipe <N3> are disposed on a side of the first sense amplification circuit 113 away from the second sense amplification circuit 123, that is, the first equalization pipe <N1> and the third equalization pipe <N3> are disposed between the first sense amplification circuit 113 and the "first memory array"; and the second equalization pipe <N2> and the fourth equalization pipe <N4> are disposed on a side of the second sense amplification circuit 123 away from the first sense amplification circuit 113, that is, the second equalization pipe <N2> and the fourth equalization pipe <N4> are disposed between the second sense amplification circuit 123 and the "second memory array".

In an example in the related art, the first equalization pipe <N1> and the third equalization pipe <N3> that precharge the first sense amplification circuit 113 are respectively disposed on both sides of the first sense amplification circuit 113; and the second equalization pipe <N2> and the fourth equalization pipe <N4> that precharge the second sense amplification circuit 123 are respectively disposed on both sides of the second sense amplification circuit 123.

In this embodiment, the third equalization pipe <N3> that precharges the second bit line BL2 connected to the second sense amplification circuit 123 is disposed on the side of the first sense amplification circuit 113 away from the second sense amplification circuit 123, and the first equalization pipe <N1> is originally disposed on the side of the first sense amplification circuit 113 away from the second sense amplification circuit 123, that is, the third equalization pipe <N3> is disposed in a gap of a region at which the first equalization pipe <N1> is located, which reduces a layout region originally required for the layout of the third equalization pipe <N3>; and the second equalization pipe <N2> that precharges the first complementary bit line BLB1 connected to the first sense amplification circuit 113 is disposed on the side of the second sense amplification circuit 123 away from the first sense amplification circuit 113, and the fourth equalization pipe <N4> is originally disposed on the side of the second sense amplification circuit 123 away from the first sense amplification circuit 113, that is, the second equalization pipe <N2> is disposed in a gap of a region at which the fourth equalization pipe <N4> is located, which reduces a layout region originally required for the layout of the second equalization pipe <N2>, thereby reducing a layout area of the readout circuit structure.

Specifically, the first complementary bit line BLB1 runs through a region at which the second sense amplification circuit 123 is located to be coupled to the first sense amplification circuit 113, and is not electrically connected to the second sense amplification circuit 123; and the second bit line BL2 runs through a region at which the first sense amplification circuit 113 is located to be coupled to the second sense amplification circuit 123, and is not electrically connected to the first sense amplification circuit 113. The first complementary bit line BLB1 runs through the region at which the second sense amplification circuit 123 is located to be coupled to the first sense amplification circuit 113, that is, the first complementary bit line BLB1 does not need to additionally occupy a layout area to complete the wiring, thereby further reducing the layout area of the readout circuit structure; and the second bit line BL2 runs through the region at which the first sense amplification circuit 113 is located to be coupled to the second sense amplification circuit 123, that is, the second bit line BL2 does not need to additionally occupy a layout area to complete the wiring, thereby further reducing the layout area of the readout circuit structure.

Further, in this embodiment, the first equalization pipe <N1> and the second equalization pipe <N2> are symmetrically disposed based on the read-write conversion circuit 102; and the third equalization pipe <N3> and the fourth equalization pipe <N4> are symmetrically disposed based on the read-write conversion circuit 102.

For the first equalization pipe <N1>, the second equalization pipe <N2>, the third equalization pipe <N3>, and the fourth equalization pipe <N4>:

in an example, the equalization signal includes a first equalization signal and a second equalization signal; the first equalization pipe <N1> and the third equalization pipe <N3> share the same gate, configured to receive the first equalization signal; and the second equalization pipe <N2> and the fourth equalization pipe <N4> share the same gate, configured to receive the second equalization signal. That is, the first equalization signal is used for precharging the first bit line BL1 connected to the first sense amplification circuit 113 and the second bit line BL2 connected to the second sense amplification circuit 123, and the second equalization signal is used for precharging the first complementary bit line BLB1 connected to the first sense amplification circuit 113 and the second complementary bit line BLB2 connected to the second sense amplification circuit 123. The first equalization pipe <N1> and the third equalization pipe <N3> that are disposed at the same region share a gate, so that a distance between an active area of the first equalization pipe <N1> and an active area of the third equalization pipe <N3> is further reduced, thereby reducing an area occupied by the first equalization pipe <N1> and the third equalization pipe <N3>; and the second equalization pipe <N2> and the fourth equalization pipe <N4> that are disposed at the same region share a gate, so that a distance between an active area of the second equalization pipe <N2> and an active area of the fourth equalization pipe <N4> is further reduced, thereby reducing an area occupied by the second equalization pipe <N2> and the fourth equalization pipe <N4>.

In another example, the first equalization signal and the second equalization signal are the same equalization signal. That is, the equalization pipes configured to precharge the first sense amplification circuit 113 and the second sense amplification circuit 123 are controlled by using the same signal.

A person skilled in the art may learn that there are a plurality of sense amplification circuits between adjacent memory arrays 101. Specifically, a plurality of sense amplification circuits are arranged in an extension direction of a word line (here the extension direction of the word line is perpendicular to the extension direction of the bit line). Referring to FIG. 2, the layout of the sense amplification circuits and the equalization pipes provided in this embodiment is further described in this embodiment by using a sense amplification circuit layout of 2×2; and in the extension direction of the word line, other sense amplification circuit structures are consistent with the sense amplification circuit layout of 2×2 shown in the figure.

Similar to the connection structure of the first sense amplification circuit 113, the third sense amplification circuit 133 is coupled to the "first memory array" by using a third bit line BL3, and is coupled to the "second memory array" by using a third complementary bit line BLB3. A fifth equalization pipe <N5> is configured to precharge the third bit line BL3, and a sixth equalization pipe <N6> is configured to precharge the third complementary bit line BLB3.

Similar to the connection structure of the second sense amplification circuit 123, the fourth sense amplification circuit 143 is coupled to the "first memory array" by using a fourth bit line BL4, and is coupled to the "second memory array" by using a fourth complementary bit line BLB4. A seventh equalization pipe <N7> is configured to precharge the fourth bit line BL4, and an eighth equalization pipe <N8> is configured to precharge the fourth complementary bit line BLB4.

The fifth equalization pipe <N5> and the seventh equalization pipe <N7> are disposed on a side of the third sense amplification circuit 133 away from the fourth sense amplification circuit 143, and the sixth equalization pipe <N6> and the eighth equalization pipe <N8> are disposed on a side of the fourth sense amplification circuit 143 away from the third sense amplification circuit 133.

In the precharge process, for the first equalization pipe <N1>, the second equalization pipe <N2>, the third equalization pipe <N3>, and the fourth equalization pipe <N4>:

in an example, the preset voltage includes a first precharge voltage, a second precharge voltage, a third precharge voltage, and a fourth precharge voltage. The gate of the first equalization pipe <N1> is configured to receive the first equalization signal EQ1, one of the source and the drain thereof is configured to receive the first precharge voltage, and the other of the source or the drain thereof is connected to the first bit line BL1; the gate of the second equalization pipe <N2> is configured to receive the second equalization signal EQ2, one of the source and the drain thereof is configured to receive the second precharge voltage, and the other of the source or the drain thereof is connected to the first complementary bit line BLB1; the gate of the third equalization pipe <N3> is configured to receive the first equalization signal EQ1, one of the source and the drain thereof is configured to receive the third precharge voltage, and the other of the source or the drain thereof is connected to the second bit line BL2; and the gate of the fourth equalization pipe <N4> is configured to receive the second equalization signal EQ2, one of the source and the drain thereof is configured to receive the fourth precharge voltage, and the other of the source or the drain thereof is connected to the second complementary bit line BLB2.

In another example, the first precharge voltage and the third precharge voltage are the same precharge voltage, and the second precharge voltage and the fourth precharge voltage are the same precharge voltage. That is, voltages used for precharging the bit lines are the same precharge voltage, and voltages used for precharging the complementary bit lines are the same precharge voltage. Further, referring to FIG. 3 and FIG. 4, the first precharge voltage, the second precharge voltage, the third precharge voltage, and the fourth precharge voltage are the same precharge voltage. That is, precharge voltages used for precharging the sense amplification circuits are the same precharge voltage VBLP. In this embodiment, the precharge voltage VBLP=1/2 VDD, here VDD is a power supply voltage inside a chip. In other embodiments, the precharge voltage VBLP may be set according to a specific application scenario.

Referring to FIG. 3 and FIG. 4, the first sense amplification circuit 113 and the third sense amplification circuit 133 are described below in detail by using the first sense amplification circuit 113 as an example. The first sense amplification circuit 113 (referring to FIG. 2) includes a sense amplification module, an isolation module and an offset cancellation module.

The sense amplification module is connected to the first bit line BL1 by using a readout bit line SABL, connected to the first complementary bit line BLB1 by using a complementary readout bit line SABLB, and configured to sense the voltage of the memory cell and output the logic 1 or 0 corresponding to the voltage.

Specifically, the sense amplification module includes: a first sense amplification NMOS pipe <N1400>, a gate thereof being connected to the first bit line BL1, a drain thereof being connected to the complementary readout bit line SABLB, and a source thereof being connected to a second signal terminal NCS, here when the sense amplification module is in an amplification stage, the second signal terminal NCS is electrically connected to a voltage corresponding to the logic 0; a second sense amplification NMOS pipe <N1405>, a gate thereof being connected to the first complementary bit line BLB1, a drain thereof being connected to the readout bit line SABL, and a source thereof being connected to the second signal terminal NCS; a first sense amplification PMOS pipe <P1401>, a gate thereof being connected to the readout bit line SABL, a drain thereof being connected to the complementary readout bit line SABLB, and a source thereof being connected to a first signal terminal PCS, here when the sense amplification module is in an amplification stage, the first signal terminal PCS is electrically connected to a voltage corresponding to the logic 1; and a second sense amplification PMOS pipe <P1400>, a gate thereof being connected to the complementary readout bit line SABLB, a drain thereof being connected to the readout bit line SABL, and a source thereof being connected to the first signal terminal PCS.

The isolation module is connected between the complementary readout bit line SABLB and the first complementary bit line BLB1, connected between the readout bit line SABL and the first bit line BL1, and configured to isolate signal interaction between the first bit line BL1 and the readout bit line SABL according to an isolation signal ISO and isolate signal interaction between the first complementary bit line BLB1 and the complementary readout bit line SABLB according to the isolation signal.

Specifically, the isolation module includes: a first isolation pipe <N1402>, a gate thereof being configured to receive the isolation signal ISO, a source thereof being connected to the first bit line BL1, and a drain thereof being connected to the readout bit line SABL; and a second isolation pipe <N1403>, a gate thereof being configured to receive the isolation signal ISO, a source thereof being connected to the first complementary bit line BLB1, and a drain thereof being connected to the complementary readout bit line SABLB.

The offset cancellation module is connected between the readout bit line SABL and the first complementary bit line BLB1, connected between the complementary readout bit line SABLB and the first bit line BL1, and configured to adjust a source-drain conduction difference between N-Metal-Oxide-Semiconductor (NMOS) pipes or P-Metal-Oxide-Semiconductor (PMOS) pipes in the sense amplification module according to an offset cancellation signal OC.

It should be noted that the "source-drain conduction difference" mentioned above means that: due to changes in manufacturing processes, temperatures, and the like, the first sense amplification NMOS pipe <N1400> as well as the second sense amplification NMOS pipe <N1405> and the first sense amplification PMOS pipe <P1401> as well as the second sense amplification PMOS pipe <P1400> may have threshold voltages different from each other. In this case, offset noise may be caused to the sense amplification module due to the difference between the threshold voltages of the first sense amplification PMOS pipe <P1401> as well as the second sense amplification PMOS pipe <P1400> and the first sense amplification NMOS pipe <N1400> as well as the second sense amplification NMOS pipe <N1405>.

Specifically, the offset cancellation module includes: a first offset cancellation pipe <N1401>, a gate thereof being configured to receive the offset cancellation signal OC, a source thereof being connected to the first bit line BL1, and a drain thereof being connected to the complementary readout bit line SABLB; and a second offset cancellation pipe <N1404>, a gate thereof being configured to receive the offset cancellation signal OC, a source thereof being connected to the first complementary bit line BLB1, and a drain thereof being connected to the readout bit line SABL.

A person skilled in the art can learn that the structure of the third sense amplification circuit 133 is the same as that of the first sense amplification circuit 113, and is also applicable to the above description after the features of the corresponding structure are replaced. Specifically, the corresponding structure includes that: the first bit line BL1 corresponds to BL3, the first complementary bit line BLB1 corresponds to BLB3, the first equalization pipe <N1> corresponds to <N5>, and the third equalization pipe <N3> corresponds to <N7>, the first sense amplification NMOS pipe <N1400> corresponds to <N1410>, the second sense amplification NMOS pipe <N1405> corresponds to <N1415>, the first sense amplification PMOS pipe <P1401> corresponds to <P1411>, the second sense amplification PMOS pipe <P1400> corresponds to <P1410>, the first isolation pipe <N1402> corresponds to <N1412>, the second isolation pipe <N1403> corresponds to <N1413>, and the first offset cancellation pipe <N1401> corresponds to <N1411>, the second offset cancellation pipe <N1404> corresponds to <N1414>.

Referring to FIG. 3 and FIG. 4, the second sense amplification circuit 123 and the fourth sense amplification circuit 143 are described below in detail by using the second sense amplification circuit 123 as an example. The second sense amplification circuit 123 (referring to FIG. 2) includes a sense amplification module, an isolation module and an offset cancellation module.

The sense amplification module is connected to the second bit line BL2 by using the readout bit line SABL, connected to the second complementary bit line BLB2 by using the complementary readout bit line SABLB, and configured to sense the voltage of the memory cell and output the logic 1 or 0 corresponding to the voltage.

Specifically, the sense amplification module includes: a third sense amplification NMOS pipe <N1425>, a gate thereof being connected to the second bit line BL2, a drain thereof being connected to the complementary readout bit line SABLB, and a source thereof being connected to a second signal terminal NCS, here when the sense amplification module is in an amplification stage, the second signal terminal NCS is electrically connected to a voltage corresponding to the logic 0; a fourth sense amplification NMOS pipe <N1420>, a gate thereof being connected to the second complementary bit line BLB2, a drain thereof being connected to the readout bit line SABL, and a source thereof being connected to the second signal terminal NCS; a third sense amplification PMOS pipe <P1421>, a gate thereof being connected to the readout bit line SABL, a drain thereof being connected to the complementary readout bit line SABLB, and a source thereof being connected to a first signal terminal PCS, here when the sense amplification module is in an amplification stage, the first signal terminal PCS is electrically connected to a voltage corresponding to the logic 1; and a fourth sense amplification PMOS pipe <P1420>, a gate thereof being connected to the complementary readout bit line SABLB, a drain thereof being connected to the readout bit line SABL, and a source thereof being connected to the first signal terminal PCS.

The isolation module is connected between the complementary readout bit line SABLB and the second complementary bit line BLB2, connected between the readout bit line SABL and the second bit line BL2, and configured to isolate signal interaction between the second bit line BL2 as well as the second complementary bit line BLB2 and the readout bit line SABL as well as the complementary readout bit line SABLB according to an isolation signal ISO.

Specifically, the isolation module includes: a first isolation pipe <N1423>, a gate thereof being configured to receive the isolation signal ISO, a source thereof being connected to the second bit line BL2, and a drain thereof being connected to the readout bit line SABL; and a second isolation pipe <N1422>, a gate thereof being configured to receive the isolation signal ISO, a source thereof being connected to the second complementary bit line BLB2, and a drain thereof being connected to the complementary readout bit line SABLB.

The offset cancellation module is connected between the readout bit line SABL and the second complementary bit line BLB2, connected between the complementary readout bit line SABLB and the second bit line BL2, and configured to adjust a source-drain conduction difference between NMOS pipes or PMOS pipes in the sense amplification module according to an offset cancellation signal OC.

It should be noted that the "source-drain conduction difference" mentioned above means that: due to changes in manufacturing processes, temperatures, and the like, the third sense amplification NMOS pipe <N1425> as well as the fourth sense amplification NMOS pipe <N1420> and the third sense amplification PMOS pipe <P1421> as well as the fourth sense amplification PMOS pipe <P1420> may have threshold voltages different from each other. In this case, offset noise may be caused to the sense amplification module due to the difference between the threshold voltages of the third sense amplification PMOS pipe <P1421> as well as the fourth sense amplification PMOS pipe <P1420> and the third sense amplification NMOS pipe <N1445> as well as the fourth sense amplification NMOS pipe <N1420>.

Specifically, the offset cancellation module includes: a third offset cancellation pipe <N1424>, a gate thereof being configured to receive the offset cancellation signal OC, a source thereof being connected to the second bit line BL2, and a drain thereof being connected to the complementary readout bit line SABLB; and a fourth offset cancellation pipe <N1421>, a gate thereof being configured to receive the offset cancellation signal OC, a source thereof being connected to the second complementary bit line BLB2, and a drain thereof being connected to the readout bit line SABL.

A person skilled in the art can learn that the structure of the fourth sense amplification circuit 143 is the same as that of the second sense amplification circuit 123, and is also applicable to the above description after the features of the corresponding structure are replaced. Specifically, the corresponding structure includes that: the second bit line BL2 corresponds to BL4, the second complementary bit line BLB2 corresponds to BLB4, the second equalization pipe <N2> corresponds to <N6>, and the fourth equalization pipe <N4> corresponds to <N8>, the third sense amplification NMOS pipe <N1425> corresponds to <N1435>, the fourth sense amplification NMOS pipe <N1420> corresponds to <N1430>, the third sense amplification PMOS pipe <P1421> corresponds to <P1431>, the fourth sense amplification PMOS pipe <P1420> corresponds to <P1430>, the third isolation pipe <N1423> corresponds to <N1433>, the fourth isolation pipe <N1422> corresponds to <N1432>, and the third offset cancellation pipe <N1424> corresponds to <N1434>, the fourth offset cancellation pipe <N1421> corresponds to <N1431>.

Referring to FIG. 5, the left part is the layout of the first sense amplification circuit 113 (referring to FIG. 2) and the third sense amplification circuit 133 (referring to FIG. 2), and the right part is the layout of the second sense amplification circuit 123 (referring to FIG. 2) and the fourth sense amplification circuit 143 (referring to FIG. 2).

For FIG. 5, the slash box region is the layout of an active layer, the white box region is the layout of a gate layer, and the shaded region is the layout of a contact layer. In this figure, the solid line arrows pass through the layout of the contact layer, indicating that the structure represented by the solid line arrows and the contact layer are in contact with each other; and any regions through which the dashed line arrows pass are not in contact with each other.

Layouts on the left side from top to bottom are sequentially: an equilibrium structure layout, a first sense amplification NMOS pipe layout, a first offset isolation layout, a first sense amplification PMOS pipe layout, a second sense amplification PMOS pipe layout, a second offset isolation layout, and a second sense amplification NMOS pipe layout.

As can be seen from the figure, in this embodiment, a gate structure of the first sense amplification NMOS pipe <N1400>, a gate structure of the second sense amplification NMOS pipe <N1405>, a gate structure of the first sense amplification PMOS pipe <P1401>, and a gate structure of the second sense amplification PMOS pipe <P1400> have the same extension direction, a gate structure of a MOS pipe in the isolation module and a gate structure of a MOS pipe in the offset cancellation module have the same extension direction, and the extension direction of the gate structure of the first sense amplification NMOS pipe <N1400> is perpendicular to the extension direction of the gate structure of the MOS pipe in the isolation module.

As can be seen from the figure, in this embodiment, the first sense amplification PMOS pipe <P1401>, the second sense amplification PMOS pipe <P1400>, the isolation module, and the offset cancellation module are disposed between the first sense amplification NMOS pipe <N1400> and the second sense amplification NMOS pipe <N1405>.

The equilibrium structure layout includes the first equalization pipe <N1>, the third equalization pipe <N3>, the fifth equalization pipe <N5>, and the seventh equalization pipe <N7>. In this embodiment, the first equalization pipe <N1>, the third equalization pipe <N3>, the fifth equalization pipe <N5>, and the seventh equalization pipe <N7> are configured to receive the same precharge voltage VBLP. That is, a part of an active area of the first equalization pipe connected to the first precharge voltage, a part of an active area of the second equalization pipe connected to the second precharge voltage, a part of an active area of the third equalization pipe connected to the third precharge voltage, and a part of an active area of the fourth equalization pipe connected to the fourth precharge voltage are in communication with each other.

In other embodiments, if the first precharge voltage and the third precharge voltage are the same precharge voltage, and the second precharge voltage and the fourth precharge voltage are the same precharge voltage, in this case, a part of the active area of the first equalization pipe connected to the first precharge voltage is in communication with a part of the active area of the third equalization pipe connected to the third precharge voltage; and a part of the active area of the second equalization pipe connected to the second precharge voltage is in communication with a part of the active area of the fourth equalization pipe connected to the fourth precharge voltage.

For the first offset isolation layout and the second offset isolation layout, the source of the first isolation pipe <N1402> is in communication with the source of the first offset cancellation pipe <N1401>, and is connected to the first bit line BL1; and the source of the second isolation pipe <N1403> is in communication with the source of the second offset cancellation pipe <N1404>, and is connected to the first complementary bit line BLB1.

Layouts on the right side from top to bottom are sequentially: an equilibrium structure layout, a third sense amplification NMOS pipe layout, a third offset isolation layout, a fourth sense amplification PMOS pipe layout, a fourth sense amplification PMOS pipe layout, a third offset isolation layout, and a third sense amplification NMOS pipe layout.

As can be seen from the figure, in this embodiment, a gate structure of the third sense amplification NMOS pipe <N1425>, a gate structure of the fourth sense amplification NMOS pipe <N1420>, a gate structure of the third sense amplification PMOS pipe <P1421>, and a gate structure of the fourth sense amplification PMOS pipe <P1420> have the same extension direction, a gate structure of a MOS pipe in the isolation module and a gate structure of a MOS pipe in the offset cancellation module have the same extension direction, and the extension direction of the gate structure of the third sense amplification NMOS pipe <N1425> is perpendicular to the extension direction of the gate structure of the MOS pipe in the isolation module.

As can be seen from the figure, in this embodiment, the third sense amplification PMOS pipe <P1421>, the fourth sense amplification PMOS pipe <P1420>, the isolation module, and the offset cancellation module are disposed between the third sense amplification NMOS pipe <N1425> and the fourth sense amplification NMOS pipe <N1420>.

The equilibrium structure layout includes the second equalization pipe <N2>, the fourth equalization pipe <N4>, the sixth equalization pipe <N6>, and the eighth equalization pipe <N8>. In this embodiment, the second equalization pipe <N2>, the fourth equalization pipe <N4>, the sixth equalization pipe <N6>, and the eighth equalization pipe <N8> are configured to receive the same precharge voltage VBLP. That is, a part of an active area of the second equalization pipe <N2> connected to the first precharge voltage, a part of an active area of the fourth equalization pipe <N4> connected to the second precharge voltage, a part of an active area of the sixth equalization pipe <N6> connected to the third precharge voltage, and a part of an active area of the eighth equalization pipe <N8> connected to the fourth precharge voltage are in communication with each other.

In other embodiments, if the first precharge voltage and the third precharge voltage are the same precharge voltage, and the second precharge voltage and the fourth precharge voltage are the same precharge voltage, in this case, a part of the active area of the first equalization pipe connected to the first precharge voltage is in communication with a part of the active area of the third equalization pipe connected to the third precharge voltage; and a part of the active area of the second equalization pipe connected to the second precharge voltage is in communication with a part of the active area of the fourth equalization pipe connected to the fourth precharge voltage.

For the third offset isolation layout and the fourth offset isolation layout, the source of the third isolation pipe <N1423> is in communication with the source of the third offset cancellation pipe <N1424>, and is connected to the second bit line BL2; and the source of the fourth isolation pipe <N1422> is in communication with the source of the fourth offset cancellation pipe <N1421>, and is connected to the second complementary bit line BLB2.

Compared with the related art, one terminal of the source and the drain of the first equalization pipe is directly connected to the first bit line to directly precharge the first bit line, one terminal of the source and the drain of the second equalization pipe is directly connected to the first complementary bit line to directly precharge the first complementary bit line, one terminal of the source and the drain of the third equalization pipe is directly connected to the second bit line to directly precharge the second bit line, and one terminal of the source and the drain of the fourth equalization pipe is directly connected to the second complementary bit line to directly precharge the second complementary bit line, that is, by directly connecting to the bit lines/complementary bit lines by using the equalization pipes, to directly charge the bit lines and the complementary bit lines, a case in which the bit lines and the complementary bit lines can only be precharged in a precharge process with turning on of a switching transistor is avoided, thereby speeding up charge of the bit lines and the complementary bit lines. In addition, the third equalization pipe that precharges the second bit line connected to the second sense amplification circuit is disposed on the side of the first sense amplification circuit away from the second sense amplification circuit, and the first equalization pipe is originally disposed on the side of the first sense amplification circuit away from the second sense amplification circuit, that is, the third equalization pipe is disposed in a gap of a region at which the first equalization pipe is located, which reduces a layout region originally required for the layout of the third equalization pipe; and the second equalization pipe that precharges the first complementary bit line connected to the first sense amplification circuit is disposed on the side of the second sense amplification circuit away from the first sense amplification circuit, and the fourth equalization pipe is originally disposed on the side of the second sense amplification circuit away from the first sense amplification circuit, that is, the second equalization pipe is disposed in a gap of a region at which the fourth equalization pipe is located, which reduces a layout region originally required for the layout of the second equalization pipe, thereby reducing a layout area of the readout circuit structure.

A person of ordinary skill in the art can understand that the foregoing embodiments are specific embodiments for implementing the present disclosure, and in an actual application, various changes can be made in forms and details without departing from the spirit and scope of the present disclosure.

INDUSTRIAL APPLICABILITY

In the embodiments of the present disclosure, one terminal of the source and the drain of the first equalization pipe is directly connected to the first bit line to directly precharge the first bit line, one terminal of the source and the drain of the second equalization pipe is directly connected to the first complementary bit line to directly precharge the first complementary bit line, one terminal of the source and the drain of the third equalization pipe is directly connected to the second bit line to directly precharge the second bit line, and one terminal of the source and the drain of the fourth equalization pipe is directly connected to the second complementary bit line to directly precharge the second complementary bit line, that is, by directly connecting to the bit lines/complementary bit lines by using the equalization pipes, to directly charge the bit lines and the complementary bit lines, a case in which the bit lines and the complementary bit lines can only be precharged in a precharge process with turning on of a switching transistor is avoided, thereby speeding up charge of the bit lines and the complementary bit lines. In addition, the third equalization pipe that precharges the second bit line connected to the second sense amplification circuit is disposed on the side of the first sense amplification circuit away from the second sense amplification circuit, and the first equalization pipe is originally disposed on the side of the first sense amplification circuit away from the second sense amplification circuit, that is, the third equalization pipe is disposed in a gap of a region at which the first equalization pipe is located, which reduces a layout region originally required for the layout of the third equalization pipe; and the second equalization pipe that precharges the first complementary bit line connected to the first sense amplification circuit is disposed on the side of the second sense amplification circuit away from the first sense amplification circuit, and the fourth equalization pipe is originally disposed on the side of the second sense amplification circuit away from the first sense amplification circuit, that is, the second equalization pipe is disposed in a gap of a region at which the fourth equalization pipe is located, which reduces a layout region originally required for the layout of the second equalization pipe, thereby reducing a layout area of the readout circuit structure.

The invention claimed is:

1. A readout circuit structure, disposed in a gap between adjacent memory arrays, the structure comprising:
   a first sense amplification circuit and a second sense amplification circuit, disposed adjacent to each other along an extension direction of a bit line, and configured to sense a voltage of a memory cell and output a logic 1 or 0 corresponding to the voltage, wherein the first sense amplification circuit is coupled to one memory array in the adjacent memory arrays by using a first bit line, and is coupled to the other memory array in the adjacent memory arrays by using a first complementary bit line, and the second sense amplification circuit is coupled to one memory array in the adjacent memory arrays by using a second bit line, and is coupled to the other memory array in the adjacent memory arrays by using a second complementary bit line;
   a first equalization pipe, one of a source and a drain thereof being connected to the first bit line;
   a second equalization pipe, one of a source and a drain thereof being connected to the first complementary bit line, wherein
   the first equalization pipe is configured to precharge a voltage of the first bit line to a preset voltage according to an equalization signal, and the second equalization pipe is configured to precharge a voltage of the first complementary bit line to the preset voltage according to the equalization signal;
   a third equalization pipe, one of a source and a drain thereof being connected to the second bit line; and a fourth equalization pipe, one of a source and a drain thereof being connected to the second complementary bit line, wherein the third equalization pipe is configured to precharge a voltage of the second bit line to the preset voltage according to the equalization signal, and the fourth equalization pipe is configured to precharge a voltage of the second complementary bit line to the preset voltage according to the equalization signal, and the first equalization pipe and the third equalization pipe are disposed on a side of the first sense amplification circuit away from the second sense amplification circuit, and the second equalization pipe and the fourth equalization pipe are disposed on a side of the second sense amplification circuit away from the first sense amplification circuit;

wherein the first complementary bit line runs through a region at which the second sense amplification circuit is located to be coupled to the first sense amplification circuit, and is not electrically connected to the second sense amplification circuit; and the second bit line runs through a region at which the first sense amplification circuit is located to be coupled to the second sense amplification circuit, and is not electrically connected to the first sense amplification circuit.

2. A readout circuit structure, disposed in a gap between adjacent memory arrays, the structure comprising:
  a first sense amplification circuit and a second sense amplification circuit, disposed adjacent to each other along an extension direction of a bit line, and configured to sense a voltage of a memory cell and output a logic 1 or 0 corresponding to the voltage, wherein the first sense amplification circuit is coupled to one memory array in the adjacent memory arrays by using a first bit line, and is coupled to the other memory array in the adjacent memory arrays by using a first complementary bit line, and the second sense amplification circuit is coupled to one memory array in the adjacent memory arrays by using a second bit line, and is coupled to the other memory array in the adjacent memory arrays by using a second complementary bit line;
  a first equalization pipe, one of a source and a drain thereof being connected to the first bit line;
  a second equalization pipe, one of a source and a drain thereof being connected to the first complementary bit line, wherein
  the first equalization pipe is configured to precharge a voltage of the first bit line to a preset voltage according to an equalization signal, and the second equalization pipe is configured to precharge a voltage of the first complementary bit line to the preset voltage according to the equalization signal;
  a third equalization pipe, one of a source and a drain thereof being connected to the second bit line; and
  a fourth equalization pipe, one of a source and a drain thereof being connected to the second complementary bit line, wherein
  the third equalization pipe is configured to precharge a voltage of the second bit line to the preset voltage according to the equalization signal, and the fourth equalization pipe is configured to precharge a voltage of the second complementary bit line to the preset voltage according to the equalization signal, and
  the first equalization pipe and the third equalization pipe are disposed on a side of the first sense amplification circuit away from the second sense amplification circuit, and the second equalization pipe and the fourth equalization pipe are disposed on a side of the second sense amplification circuit away from the first sense amplification circuit;
  wherein the equalization signal comprises a first equalization signal and a second equalization signal; the first equalization pipe and the third equalization pipe share a same gate, configured to receive the first equalization signal; and the second equalization pipe and the fourth equalization pipe share a same gate, configured to receive the second equalization signal.

3. The readout circuit structure according to claim 2, wherein the first equalization signal and the second equalization signal are a same equalization signal.

4. The readout circuit structure according to claim 2, wherein the preset voltage comprises a first precharge voltage, a second precharge voltage, a third precharge voltage, and a fourth precharge voltage,
  the gate of the first equalization pipe is configured to receive the first equalization signal, one of the source and the drain of the first equalization pipe is configured to receive the first precharge voltage, and the other of the source and the drain of the first equalization pipe is connected to the first bit line;
  the gate of the second equalization pipe is configured to receive the second equalization signal, one of the source and the drain of the second equalization pipe is configured to receive the second precharge voltage, and the other of the source and the drain of the second equalization pipe is connected to the first complementary bit line;
  the gate of the third equalization pipe is configured to receive the first equalization signal, one of the source and the drain of the third equalization pipe is configured to receive the third precharge voltage, and the other of the source and the drain of the third equalization pipe is connected to the second bit line; and
  the gate of the fourth equalization pipe is configured to receive the second equalization signal, one of the source and the drain of the fourth equalization pipe is configured to receive the fourth precharge voltage, and the other of the source and the drain of the fourth equalization pipe is connected to the second complementary bit line.

5. The readout circuit structure according to claim 4, wherein the first precharge voltage, the second precharge voltage, the third precharge voltage and the fourth precharge voltage are a same precharge voltage.

6. The readout circuit structure according to claim 4, wherein the first precharge voltage and the third precharge voltage are a same precharge voltage, and the second precharge voltage and the fourth precharge voltage are a same precharge voltage.

7. The readout circuit structure according to claim 6, wherein a part of an active area of the first equalization pipe connected to the first precharge voltage is in communication with a part of an active area of the third equalization pipe connected to the third precharge voltage; and a part of an active area of the second equalization pipe connected to the second precharge voltage is in communication with a part of an active area of the fourth equalization pipe connected to the fourth precharge voltage.

8. The readout circuit structure according to claim 1, further comprising:
  a read-write conversion circuit, disposed between the first sense amplification circuit and the second sense amplification circuit, and configured to write external data into a memory cell of the memory array, or read out data in the memory cell, wherein the first equalization pipe and the third equalization pipe are symmetrically disposed based on the read-write conversion circuit; and the second equalization pipe and the fourth equalization pipe are symmetrically disposed based on the read-write conversion circuit.

9. A readout circuit structure, disposed in a gap between adjacent memory arrays, the structure comprising:

a first sense amplification circuit and a second sense amplification circuit, disposed adjacent to each other along an extension direction of a bit line, and configured to sense a voltage of a memory cell and output a logic 1 or 0 corresponding to the voltage, wherein the first sense amplification circuit is coupled to one memory array in the adjacent memory arrays by using a first bit line, and is coupled to the other memory array in the adjacent memory arrays by using a first complementary bit line, and the second sense amplification circuit is coupled to one memory array in the adjacent memory arrays by using a second bit line, and is coupled to the other memory array in the adjacent memory arrays by using a second complementary bit line;

a first equalization pipe, one of a source and a drain thereof being connected to the first bit line;

a second equalization pipe, one of a source and a drain thereof being connected to the first complementary bit line, wherein the first equalization pipe is configured to precharge a voltage of the first bit line to a preset voltage according to an equalization signal, and the second equalization pipe is configured to precharge a voltage of the first complementary bit line to the preset voltage according to the equalization signal;

a third equalization pipe, one of a source and a drain thereof being connected to the second bit line; and a fourth equalization pipe, one of a source and a drain thereof being connected to the second complementary bit line, wherein the third equalization pipe is configured to precharge a voltage of the second bit line to the preset voltage according to the equalization signal, and the fourth equalization pipe is configured to precharge a voltage of the second complementary bit line to the preset voltage according to the equalization signal, and the first equalization pipe and the third equalization pipe are disposed on a side of the first sense amplification circuit away from the second sense amplification circuit, and the second equalization pipe and the fourth equalization pipe are disposed on a side of the second sense amplification circuit away from the first sense amplification circuit;

wherein the first sense amplification circuit comprises:

a sense amplification module, connected to the first bit line by using a readout bit line, connected to the first complementary bit line by using a complementary readout bit line, and configured to sense the voltage of the memory cell and output the logic 1 or 0 corresponding to the voltage;

an isolation module, connected between the complementary readout bit line and the first complementary bit line, connected between the readout bit line and the first bit line, and configured to isolate signal interaction between the first bit line and the readout bit line according to an isolation signal and isolate signal interaction between the first complementary bit line and the complementary readout bit line according to the isolation signal; and an offset cancellation module, connected between the readout bit line and the first complementary bit line, connected between the complementary readout bit line and the first bit line, and configured to adjust a source-drain conduction difference between N-Metal-Oxide-Semiconductor (NMOS) pipes or P-Metal-Oxide-Semiconductor (PMOS) pipes in the sense amplification module according to an offset cancellation signal.

10. The readout circuit structure according to claim 9, wherein the sense amplification module comprises:

a first sense amplification NMOS pipe, a gate thereof being connected to the first bit line, a drain thereof being connected to the complementary readout bit line, and a source thereof being connected to a second signal terminal, wherein when the sense amplification module is in an amplification stage, the second signal terminal is electrically connected to a voltage corresponding to the logic 0;

a second sense amplification NMOS pipe, a gate thereof being connected to the first complementary bit line, a drain thereof being connected to the readout bit line, and a source thereof being connected to the second signal terminal;

a first sense amplification PMOS pipe, a gate thereof being connected to the readout bit line, a drain thereof being connected to the complementary readout bit line, and a source thereof being connected to a first signal terminal, wherein when the sense amplification module is in an amplification stage, the first signal terminal is electrically connected to a voltage corresponding to the logic 1; and a second sense amplification PMOS pipe, a gate thereof being connected to the complementary readout bit line, a drain thereof being connected to the readout bit line, and a source thereof being connected to the first signal terminal.

11. The readout circuit structure according to claim 10, wherein a gate structure of the first sense amplification NMOS pipe, a gate structure of the second sense amplification NMOS pipe, a gate structure of the first sense amplification PMOS pipe, and a gate structure of the second sense amplification PMOS pipe have a same extension direction, a gate structure of a MOS pipe in the isolation module and a gate structure of a MOS pipe in the offset cancellation module have a same extension direction, and the extension direction of the gate structure of the first sense amplification NMOS pipe is perpendicular to the extension direction of the gate structure of the MOS pipe in the isolation module.

12. The readout circuit structure according to claim 10, wherein the first sense amplification PMOS pipe, the second sense amplification PMOS pipe, the isolation module, and the offset cancellation module are disposed between the first sense amplification NMOS pipe and the second sense amplification NMOS pipe.

13. The readout circuit structure according to claim 9, wherein the isolation module comprises:

a first isolation pipe, a gate thereof being configured to receive the isolation signal, a source thereof being connected to the first bit line, and a drain thereof being connected to the readout bit line; and a second isolation pipe, a gate thereof being configured to receive the isolation signal, a source thereof being connected to the first complementary bit line, and a drain thereof being connected to the complementary readout bit line.

14. The readout circuit structure according to claim 13, wherein the offset cancellation module comprises:
   a first offset cancellation pipe, a gate thereof being configured to receive the offset cancellation signal, a source thereof being connected to the first bit line, and a drain thereof being connected to the complementary readout bit line; and
   a second offset cancellation pipe, a gate thereof being configured to receive the offset cancellation signal, a source thereof being connected to the first complementary bit line, and a drain thereof being connected to the readout bit line.

15. The readout circuit structure according to claim 14, wherein the source of the first isolation pipe is in communication with the source of the first offset cancellation pipe, and is connected to the first bit line; and the source of the second isolation pipe is in communication with the source of the second offset cancellation pipe, and is connected to the first complementary bit line.

* * * * *